US00RE34634E

United States Patent [19]

Konno et al.

[11] E Patent Number: Re. 34,634

[45] Reissued Date of Patent: Jun. 7, 1994

[54] LIGHT ILLUMINATION DEVICE

[75] Inventors: Kunio Konno, Yokohama; Masashi Okada, Yotsukaido, both of Japan

[73] Assignee: Nippon Kogaku Kabushiki Kaisha, Tokyo, Japan

[21] Appl. No.: 924,789

[22] Filed: Aug. 6, 1992

Related U.S. Patent Documents

Reissue of:

[64] Patent No.: 4,497,015
Issued: Jan. 29, 1985
Appl. No.: 468,551
Filed: Feb. 22, 1983

U.S. Applications:

[63] Continuation of Ser. No. 823,873, Jan. 28, 1986, abandoned.

[30] Foreign Application Priority Data

Feb. 26, 1982 [JP] Japan ..... 57-30268

[51] Int. Cl.[5] ..... F21V 7/04

[52] U.S. Cl. ..... 362/268; 353/38; 353/98; 355/67

[58] Field of Search ..... 362/268, 32, 293, 308, 362/331, 346; 353/38, 97, 98; 355/67, 71; 359/619, 621, 622

[56] References Cited

U.S. PATENT DOCUMENTS

| | | | |
|---|---|---|---|
| 3,267,802 | 8/1966 | Noble | 362/268 |
| 3,296,923 | 1/1967 | Miles | 335/38 |
| 3,941,475 | 3/1976 | Sheets | 362/268 |
| 4,206,494 | 6/1980 | Lovering | 362/32 |

FOREIGN PATENT DOCUMENTS 54-138649 9/1979 Japan .

*Primary Examiner*—Richard R. Cole
*Attorney, Agent, or Firm*—Sughrue, Mion, Zinn, Macpeak & Seas

[57] ABSTRACT

A device for providing an illumination of an object includes first and second optical integrators disposed on an optical axis in spaced-apart relationship. Light rays emitted from a point light source formed by an elliptical reflector mirror having a light-emitting source are incident on the first optical integrator, which forms a plurality of secondary images of the point light source. The second optical integrator receives luminous fluxes emitted from the secondary light source images to form a multiplicity of secondary images of the secondary light source images formed by the first optical integrator. Luminous fluxes from the secondary images formed by the second optical integrator are superimposed by a condenser lens on the object for illuminating the latter with light beams of uniform intensity.

16 Claims, 2 Drawing Sheets

LIGHT ILLUMINATION DEVICE

Matter enclosed in heavy brackets [ ] appears in the original patent but forms no part of this reissue specification; matter printed in italics indicates the additions made by reissue.

*This is a continuation of application No. 07/823,873 filed Jan. 28, 1986, abandoned.*

BACKGROUND OF THE INVENTION

1. Field of the Invention

The present invention relates to a light illumination device for illuminating an object with light rays uniform in intensity, and more particularly to a light illumination system suitable for use in an exposure device for fabricating semiconductor devices such as ICs.

2. Description of the Prior Art

Exposure devices for transferring integrated-circuit patterns on reticles or photomasks onto substrates need a light illumination device for providing an illumination by light rays having a flat or uniform intensity distribution in order to project an image of the fine circuit patterns onto a substrate with a higher resolution.

One such light illumination device is known from U.S. Pat. No. 3,296,923 issued on Jan. 10, 1967 to J. R. Miles.

The light illumination device as described in the above-mentioned U.S. Patent has a collimating lens for collimating a luminous flux or light beam from an elliptical reflector mirror, first and second lenticular lenses for forming a plurality of secondary light sources from the luminous flux from the collimating lens, and a large aperture condenser lens disposed between the lenticular lenses and a substrate. This prior art light illumination device is capable of correcting luminous flux having an annular intensity distribution pattern weaker in the vicinity of the optical axis and stronger at the peripheral edge in the opening of the elliptical mirror, into luminous flux having a substantially flat intensity distribution on an object surface disposed behind the condenser lens. With the conventional device, however, the luminous flux of flat intensity distribution is available only on a plane corresponding to the object surface, and the annular intensity distribution pattern is left unremoved anywhere behind the condenser lens except for the object surface. This is because the luminous flux per se emitted from the first and second lenticular lenses have such an intensity distribution pattern.

For providing an illumination of the object with luminous flux rom the known device, it is necessary to position the object extremely critically along the optical axis so as to attain a desired flat intensity distribution pattern on the object. Where the conventional system is employed, for example, as a light projection system for projecting an image of the object onto a projection surface with a projection lens, there is provided a flat intensity distribution pattern on focal points of the projection lens, that is, the object surface and the projection surface. However, an annular intensity pattern is produced at other planes, in particular, the pupil plane of the projection lens. As a result, the light projection system suffers from various difficulties such as a reduction in the resolving power of the projection lens, a reduction in the depth of focus thereof, and the like.

SUMMARY OF THE INVENTION

It is an object of the present invention to provide a light illumination device for illuminating an object with luminous flux having a uniform intensity distribution, the light illumination device being particularly capable of providing an illumination of substantially uniform intensity in the vicinity of an object surface.

Another object of the present invention is to provide a light illumination device for emitting luminous flux having a substantially uniform intensity distribution anywhere in the path of illumination.

A light illumination device according to the present invention has a plurality of optical means for separating incident light beams into a multiplicity of luminous fluxes. Each of the optical means is a functional equivalent of a pair of the first and second lenticular lenses described above. The plurality of optical means are arranged in series on the optical axis between an elliptical mirror and an object. The first optical means receives light beams emitted from a point light source formed by the elliptical mirror and forms secondary light source images. The second optical means receives luminous fluxes from the secondary light source images formed by the first optical means and forms secondary images of the secondary light source images.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1A:
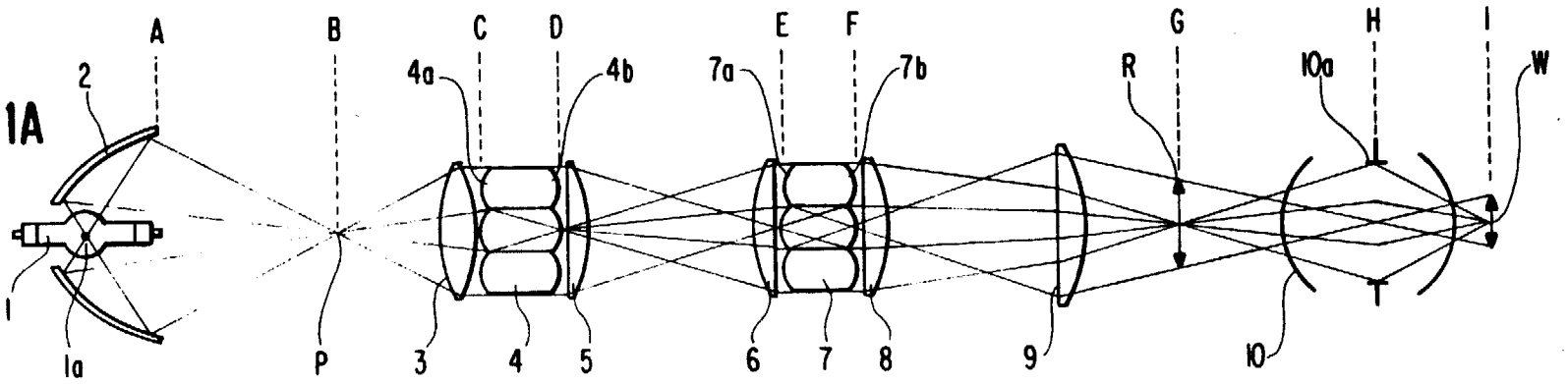
FIG. 1A is a schematic plan view of a projection exposure system having a light illumination device according to an embodiment of the present invention.

FIG. 1A illustrates the arrangement of optical members of a reduced-projection exposure system for printing on a wafer an reduced image of a circuit pattern drawn on a photomask or reticle. A light-emitting tube 1 has a light source 1a of high brightness energy disposed in the vicinity of a first focal point of an elliptical reflector mirror 2. An image P of the light source 1a is focused by the elliptical reflector mirror 2 at a position near a second focal point of the mirror 2, the image P serving substantially as a point light source. A collimator lens 3 is positioned with its front focal point at the light source image P for collimating luminous flux from the image P. A first optical integrator 4 is disposed in the collimated luminous flux for separating the latter into a multiplicity of luminous fluxes, so that a plurality of secondary light source images are formed on the exit side of the optical integrator 4. The luminous fluxes leaving the optical integrator 4 pass through an output lens 5 and enter a second optical integrator 7 located between an input lens 6 and an output lens 8.

Figure 2:
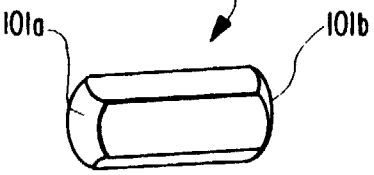
FIG. 2 is a perspective view of an element lens of an optical integrator.

Each of the optical integrators 4, 7 is composed of a number of lens elements each comprising an optical glass block 101 in the form of a hexagonal prism as shown in FIG. 2. The glass block 101 has front and rear end faces 101a, 101b formed as convex lenses. The lens elements in each optical integrator are assembled into a honeycomb configuration.

Figure 3:
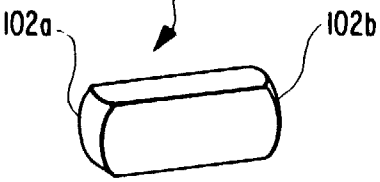
FIG. 3 is a perspective view of a modified element lens of the optical integrator.

The transverse cross-sectional shape of each lens element may be selected to meet a particular application of the light illumination device. For example, where the region to be illuminated is of a rectangular shape, it is preferable to employ a lens element 102 in the form of a quadrangular prism as shown in FIG. 3. The lens element 102 includes front and rear convex lenses 102a, 102b.

Figure 4:
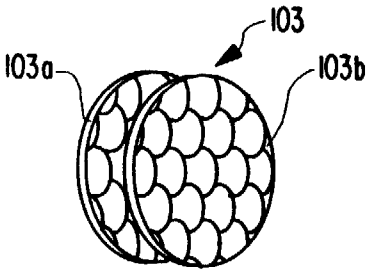
FIG. 4 is a perspective view of fly-eye lenses.

Each of the optical integrators 4, 7 may be composed of an lens element 103 having a pair of front and rear fly-eye lenses 103a 103b spaced a preset interval from each other as illustrated in FIG. 4. Each of the fly-eye lenses comprises a flat sheet of glass having on one surface a multiplicity of small lenses formed by pressing.

The front lenses 101a, 102a, 103a and the rear lenses 101b, 102b, 103b of the lens elements 101, 102, 103, respectively, have substantially equal refractive powers. The front and rear lenses are spaced apart from each other by an interval equal to the rear focal length of the front lenses and also to the front focal length of the rear lenses. Therefore, the front lenses 4a of the optical integrator 4 serve to form the light source image P on the exit surfaces of the corresponding rear lenses 4b of the optical integrator 4. The lens 3 can form the light source image P on the optical axes of the rear lenses 4b. The rear lenses 4b serve to form the images of the front lenses 4a on the entrance surface of the second optical integrator 7. The entrance surfaces of the optical integrators 4, 7 are in conjugate relationship. The lens 5 has a power to position its rear focal point on the entrance surface of the second optical integrator 7.

The front lenses 7a of the second optical integrator 7 are capable of forming the image of the exit surface of the first optical integrator 4 on the exit surfaces of the rear lenses 7b. Accordingly, the exit surfaces of the optical integrators 4, 7 are in conjugate relationship. The input lens 6 serves to form the image of the exit surface of the optical integrator 4 formed on the exit surfaces of the rear lenses 7b, on the optical axes of the rear lenses 7b. The rear lenses 7b have powers and radii of curvature selected to form the images of the entrance surfaces of the corresponding front lenses 7a on a reticle R through a large aperture condenser lens 9. By arranging the output lens 8 and the large aperture condenser lens 9 so that a rear focal point of the combined system of the lenses 8, 9 is placed on the pattern surface of the reticle R, a multiplicity of luminous fluxed leaving the second optical integrator 7 are all superimposed on the reticle R.

Provision of the output lens 8 is effective in reducing the aperture of the condenser lens 9 and shortening the distance from the collimator lens 3 to the reticle R. The condenser lens 9 is positioned to form the image of the exit surface of the second optical integrator 7 on a pupil 10a of a projection lens 10. The projection lens 10 forms the image of the circuit pattern of the reticle R on a wafer W.

For irradiating the object or reticle R efficiently with luminous fluxes from the light source image P, the two optical integrators should be shaped and arranged in tandem or series on to meet the following conditions:

Let the overall aperture of the first optical integrator 4 be indicated by $R_1$, the overall aperture of the second optical integrator 7 by $R_2$, the aperture of each lens element of the first optical integrator 4 by $d_1$, and the aperture of each lens element of the second optical integrator 7 by $d_2$. The entrance surfaces of the optical integrators should be in mutually conjugate relationship, and the image magnification $\beta_1$ of the rear lenses 4b should meet the relationship $\beta_1=R_2/d_1$. The exit surfaces of the optical integrators should be in mutually conjugate relationship, and the image magnification $\beta_2$ of the front lenses 7a should meet the relationship $\beta_2=d_2/R_1$. Where each optical integrator is composed of lens elements of equal shape, the two optical integrators should be arranged to satisfy the relationship $\beta_1 \cdot \beta_2=1$.

Light intensity distributions in the light path of the optical system shown in FIG. 1A will be explained.

Figure 1B:
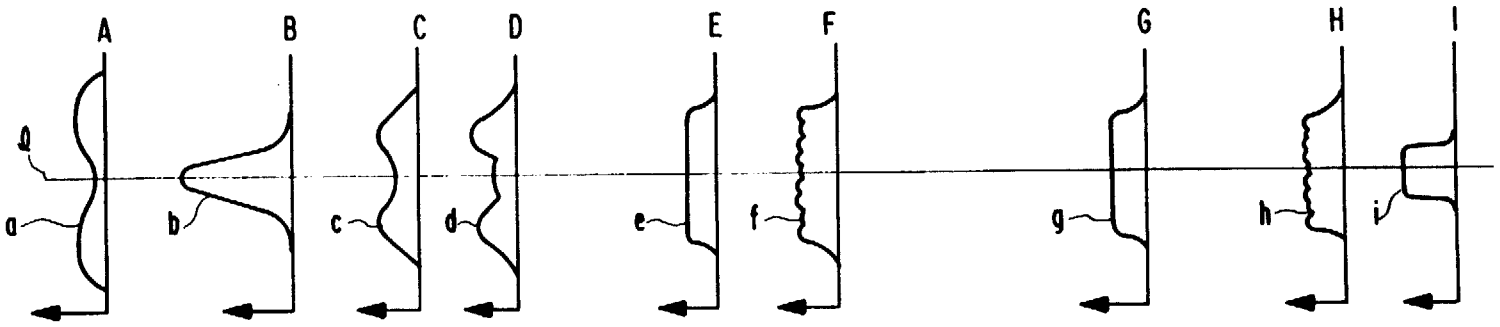
FIG. 1B is a graph showing light intensity distributions in various positions on an optical axis of the system shown in FIG. 1A.

FIG. 1B is illustrative of such light intensity distributions at the aperture plane A of the elliptical mirror 2, at the second focal point plane B, at the entrance and exit surfaces C, D of the first integrator 4, at the entrance and exit surfaces E, F of the second optical integrator 7, at the pattern surface G of the reticle R, at the pupil plane H of the projection lens 10, and at the surface I of the wafer W. Since the elliptical mirror 2 has a central opening for the installation of the light-emitting tube 1, the intensity distribution a at the plane A is of an annular pattern such that the intensity is weaker in the vicinity of the optical axis l and stronger at the peripheral edge. The plane B has an intensity distribution b having a sharp peak on the optical axis because of the light source image P formed by the elliptical mirror 2. The intensity distribution c at the surface C is of an annular pattern with a lower intensity in the vicinity of the optical axis l, the intensity being greater than that of the intensity distribution pattern at the surface A.

Reduced images of the plane B are formed at the rear ends of the lens elements of the optical integrator 4. The surface D has a light intensity distribution d of an annular pattern which is the product of the intensity distribution at the surface C and the light intensities at the element lenses.

The surface E has a flat intensity distribution pattern e as the multiple secondary light source images formed on the surface D are all superimposed at the surface E. Reduced images of the surface D are formed on the surface F, that is, secondary light source images of the secondary light sources are formed on the surface F. Therefore, as many reduced images are formed on the surface F as there are element lenses, and the intensity pattern f at the surface F is generally flat, not annular as is the intensity pattern d at the surface D, though the pattern f includes small intensity variations. The surface G of the reticle R has an intensity distribution g of a flat pattern since all of luminous fluxes from the lens elements of the second optical integrator 7 are superimposed on the reticle R. The plane H, which is in conjugate relationship with the surface F, has an intensity distribution h similar to the intensity distribution f. The intensity distribution i at the surface I is of a flat pattern as it is similar to the intensity distribution g at the surface G.

As described above, the optical integrators serve to break up uneven light rays incident thereon into as many luminous fluxes as there are lens elements thereof to generate a multiplicity of secondary light sources immediately behind the optical integrators. Luminous fluxes emitted from these secondary light sources are superimposed on the surface illuminated. The secondary light sources have orientation characteristics that are small divisions of the orientation characteristics of the original light source. The divided orientation characteristics are each comparatively uniform, and will be superimposed so that their irregularities can be cancelled out. Therefore, the intensity distribution at the irradiated surface is rendered uniform. If the orientation characteristics of the original light source remain the same, the intensity uniformity at the illuminated surface becomes better as the number of the secondary light sources increase. Assuming that the number of the lens elements of the first optical integrator 4 is $n_1$, and the number of the lens elements of the second optical integrator 4 is $n_2$, the light source image P at the second focal point of the elliptical mirror 2 is duplicated into $n_1$ light source images at the exit surface of the first optical integrator 4. Since the image of the surface D is projected in $n_2$ duplicates onto the exit surface F of the second optical integrator 7, a total of $n_1 \times n_2$ secondary light source images of the light source image P are formed on the surface F. The increased number of the secondary light source images on the surface F makes the light intensity uniform thereon as a whole. This uniform intensity is equivalent to that which would be given by an optical integrator having $n_1 \times n_2$ lens elements. The secondary light source images on the exit surface of each optical integrator may not necessarily be formed on the surfaces of the lens elements, but may be generated on positions spaced from the lens element surfaces in view of flaws and dust on such surfaces.

With the embodiment of the present invention, not only the reticle R and the wafer W are uniformly illuminated, but also the exit plane 10a of the projection lens 10 has a uniform intensity distribution pattern. As a result, the resolving power of a projected image is increased, and the projection lens 10 has an increased depth of focus.

Figure 5:
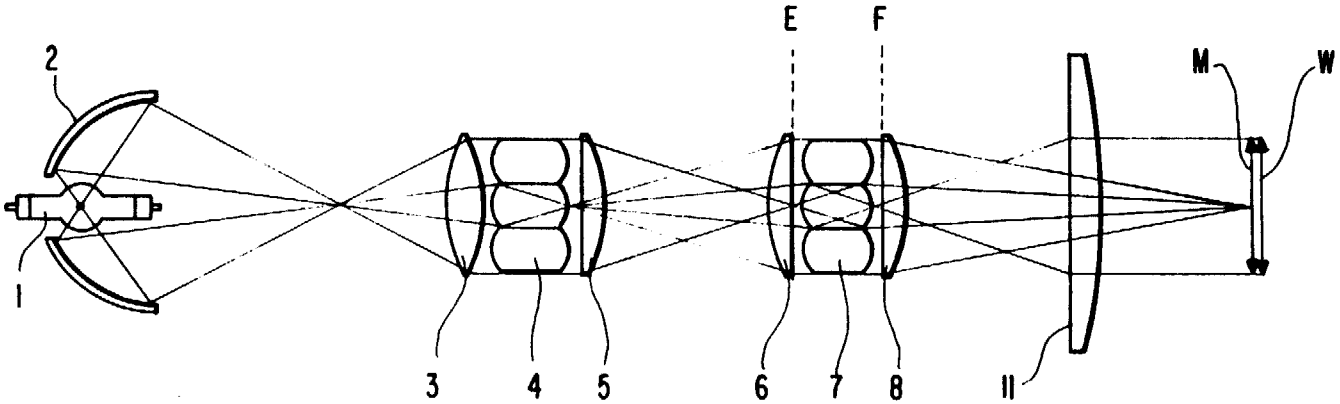
FIG. 5 is a schematic plan view of a contact or proximity type exposure system incorporating a light illumination device according to an embodiment of the present invention.

FIG. 5 shows a contact or proximity type exposure system incorporating a light illumination device of the present invention. The exposure system has optical elements 1 through 8 which are the same as those having the same reference numbers in FIG. 1A. The exposure system of the type described is required to irradiate a photomask M and a wafer W with parallel luminous fluxes. To this end, the exposure system includes a condenser lens 11 for collimating light rays from the exit surface of the second optical integrator 7, that is, light rays emitted from the multiple secondary light source images formed on the surface F. The images of the entrance surfaces E of the front lenses 7a of the lens elements of the second optical integrator 7 are all superimposed on the photomask M and the wafer W. Accordingly, the photomask M is irradiated with highly uniform, parallel luminous fluxes.

With this embodiment, the exit surface of the second integrator 7 has a uniform intensity distribution for a uniform illumination of the photomask M and the wafer W and a uniform angular spread of illuminating light rays. As a consequence, ringing due to the Fresnel diffraction can be removed, and blurred images can be smoothed.

Three or more optical integrators may be employed. For an efficient illumination of an object, adjacent ones of such optical integrators should be arranged so that the entrance surfaces will be mutual conjugates and also the exit surfaces will be mutual conjugates with the magnifications selected as described above.

Although certain preferred embodiments have been shown and described, it should be understood that many changes and modifications may be made therein without departing from the scope of the appended claims.

What is claimed is:

1. A device for uniformly illuminating an object comprising:

(a) means for providing a light source;

(b) first optical means disposed to intersect across light energy emitted from said light source, said first optical means including a first multiplicity of lens elements for forming a multiplicity of images of said light source on a first focal plane and a second multiplicity of lens elements disposed in the vicinity of said first focal plane and corresponding respectively to said first multiplicity of lens elements for forming an image of said first multiplicity of lens elements on a second focal plane;

(c) second optical means disposed to intersect across light energy emitted from said first optical means, said second optical means including a third multiplicity of lens elements disposed in the vicinity of said second focal plane for forming a multiplicity of images of said second multiplicity of lens elements on a third focal plane and a fourth multiplicity of lens elements disposed in the vicinity of said third focal plane and corresponding respectively to said third multiplicity of lens elements; and (d) third optical means for superimposing light energy emitted from said second optical means on said object.

2. A device according to claim 1, wherein said first optical means includes collimator means disposed between said light source and said first multiplicity of lens elements for converting the light energy from said light source into collimated light energy.

3. A device according to claim 1, wherein said third optical means includes condenser lens means, said fourth multiplicity of lens elements cooperating with said condenser lens means to form an image of said third multiplicity of lens elements on said object.

4. A device for projecting a pattern on a photomask onto a base plate through a projecting optical system, comprising:

(a) means for providing a light source;

(b) first optical means disposed to intersect across light energy emitted from said light source, said first optical means including a first multiplicity of lens elements for forming a multiplicity of images of said light source on a first focal plane and a second multiplicity of lens elements disposed in the vicinity of said first focal plane and corresponding respectively to said first multiplicity of lens elements for forming an image of said first multiplicity of lens elements on a second focal plane;

(c) second optical means disposed to intersect across light energy emitted from said first optical means, said second optical means including a third multiplicity of lens elements disposed in the vicinity of said second focal plane for forming a multiplicity of images of said second multiplicity of lens elements on a third focal plane and a fourth multiplicity of lens elements disposed in the vicinity of said third focal plane and corresponding respectively to said third multiplicity of lens elements; and (d) third optical means disposed to intersect across light energy emitted from said second optical means, said third optical means forming an image of said fourth multiplicity of lens elements on a pupil of said projecting optical system.

5. A device for uniformly illuminating an object, comprising:

(a) means for providing a light source;

(b) collimator means for converting the light energy from said light source into collimated light energy;

(c) first multiplicity of imaging lens elements and second multiplicity of imaging lens elements disposed in matrix form, respectively, adjacent to a first plane and a second plane which intersects perpendicular to said collimated light energy in order, said second multiplicity of imaging lens elements each corresponding to said first multiplicity of imaging lens elements;

(d) third multiplicity of imaging lens elements and fourth multiplicity of imaging lens elements disposed in matrix form, respectively, adjacent to a third plane and a fourth plane which intersect perpendicular to the light energy passing through said first and second planes in order, said fourth multiplicity of imaging lens elements each corresponding to said third multiplicity of imaging lens elements; and (e) wherein said light source, said second plane, and said fourth plane [and said object] are in optically conjugate relation to one another and said first plane and said third plane are in optically conjugate relation to each other.

6. A device according to claim 5, wherein each of said lens elements of said second multiplicity of imaging lens elements has an image magnification $\beta_1$ satisfying the relationship $\beta_1 = R_2/d_1$, and each of said lens elements of said third multiplicity of imaging lens elements has an image magnification $\beta_2$ satisfying the relationship $\beta_2 = d_2/R_1$, where $R_1$ is the aperture of the first and second multiplicities of imaging lens elements, $d_1$ the aperture of each of said lens elements of said first and second multiplicities of imaging lens elements, $R_2$ the aperture of the third and fourth multiplicities of imaging lens elements, and $d_2$ the aperture of each of said lens elements of said third and fourth multiplicity of imaging lens elements.

*7. An illuminating apparatus for irradiating a surface, said apparatus comprising:*

*illuminating means for forming a plurality of secondary light sources;*

*multi-beam forming optical means for forming multiple light beams from the radiant energy from said secondary light sources;*

*collimating optical means for substantially collimating the radiant energy from said secondary light sources and directing the radiant energy to said multi-beam forming optical means to be formed as multiple light beams thereby; and*

*converging optical means for converging the radiant energy as the multiple light beams from said multi-beam forming optical means on the surface to be irradiated.*

*8. An illuminating apparatus according to claim 7, wherein said illuminating means comprises a light source, a multi-beam forming optical element for forming multiple light beams as said plurality of light sources, and converging optical element for converging the radiant energy from said light source on said multi-beam forming optical element.*

*9. An illuminating apparatus according to claim 8, wherein said multi-beam forming optical element is a set of lens arrays disposed at the focus positions thereof.*

*10. An illuminating apparatus according to claim 8, wherein said multi-beam forming optical means is a set of lens arrays disposed at the focus positions thereof, and wherein in the direction of the optical axis of said apparatus, the forward one of said lens arrays is disposed substantially on the rearward focal plane of said collimating optical means, and the rearward one of said lens arrays is disposed substantially on the forward focal plane of said converging optical means.*

*11. An illuminating apparatus according to claim 8, wherein said converging optical element comprises an elliptical mirror.*

*12. An illuminating apparatus according to claim 7, wherein said multi-beam forming optical means is a set of lens arrays disposed at the focus positions thereof.*

*13. An illuminating apparatus for irradiating a surface, said apparatus comprising:*

*a light source for producing light;*

*first multi-beam forming optical means for forming multiple light beams;*

*first converging optical means for converging the light produced by said light source on said first multi-beam forming optical means to be formed into multiple light beams thereby;*

*second multi-beam forming optical means for forming multiple light beams;*

*lens means for converging the multiple light beams from said first multi-beam forming optical means on said second multi-beam forming optical means to be formed into multiple light beams thereby; and*

*second converging optical means for converging the multiple light beams from said second multi-beam forming optical means on the surface to be irradiated.*

*14. An illuminating apparatus according to claim 13, wherein said surface to be irradiated is provided with a mask.*

*15. An illuminating apparatus according to claim 13, wherein said first multi-beam forming optical means is a set of lens arrays disposed at the focus positions thereof.*

*16. An illuminating apparatus according to claim 13, wherein said multi-beam forming optical means is a set of lens arrays disposed at the focus positions thereof.*

* * * * *